(12) United States Patent
Bindig

(10) Patent No.: US 8,823,244 B2
(45) Date of Patent: Sep. 2, 2014

(54) MONOLITHIC MULTI-LAYERED ACTUATOR WITH EXTERNAL ELECTRODES MADE OF A METALLIC, POROUS, EXPANDABLE CONDUCTIVE LAYER

(75) Inventor: Reiner Bindig, Bindlach (DE)

(73) Assignee: CeramTec GmbH (DE)

( * ) Notice: Subject to any disclaimer, the term of this patent is extended or adjusted under 35 U.S.C. 154(b) by 584 days.

(21) Appl. No.: 13/129,437

(22) PCT Filed: Nov. 19, 2009

(86) PCT No.: PCT/EP2009/065433
§ 371 (c)(1),
(2), (4) Date: May 16, 2011

(87) PCT Pub. No.: WO2010/057939
PCT Pub. Date: May 27, 2010

(65) Prior Publication Data
US 2011/0241494 A1    Oct. 6, 2011

(30) Foreign Application Priority Data

Nov. 20, 2008    (DE) .................. 10 2008 043 912
Jun. 25, 2009    (DE) .................. 10 2009 027 192

(51) Int. Cl.
*H01L 41/083* (2006.01)
*H01L 41/047* (2006.01)
(52) U.S. Cl.
CPC ............. *H01L 41/047* (2013.01); *H01L 41/083* (2013.01)
USPC .......................................... 310/328; 310/364

(58) Field of Classification Search
CPC .. H01L 41/083; H01L 41/047; H01L 41/0913
USPC ........................................ 310/328, 365–366
See application file for complete search history.

(56) References Cited

U.S. PATENT DOCUMENTS

| | | | |
|---|---|---|---|
| 4,845,399 A | 7/1989 | Yasuda et al. | |
| 5,281,855 A | 1/1994 | Zirbes et al. | |
| 5,406,164 A | 4/1995 | Okawa et al. | |
| 6,140,749 A * | 10/2000 | Nakatani ...................... | 310/366 |
| 6,798,123 B2 * | 9/2004 | Bindig et al. ................. | 310/364 |
| 6,891,313 B1 * | 5/2005 | Henneken et al. ........... | 310/328 |
| 7,042,143 B2 * | 5/2006 | Bindig et al. ................. | 310/366 |

(Continued)

FOREIGN PATENT DOCUMENTS

| | | |
|---|---|---|
| DE | 10 2004 042 373 A1 | 3/2005 |
| EP | 0 844 678 A1 | 5/1998 |

(Continued)

*Primary Examiner* — J. San Martin
(74) *Attorney, Agent, or Firm* — Fulbright & Jaworski LLP

(57) ABSTRACT

A monolithic multilayer actuator made of a sintered stack of thin films of piezoceramio with embedded metallic internal electrodes. All metallic internal electrodes of one polarity are electrically connected in parallel by way of a base metallization applied to the stack and wherein an external electrode is connected in an electrically conducting manner to the base metallization for electrical contacting purposes. In order to provide that the external electrode can be applied to the base metallization using simple and cost-effective means so that said electrode is expandable such that it dissipates the cracks arising from cracking energy in the actuator without the external electrode disconnecting in the process that are sintered together, the layer being applied onto the base metallization.

18 Claims, 3 Drawing Sheets

(56) References Cited

U.S. PATENT DOCUMENTS

| | | | |
|---|---|---|---|
| 7,358,653 B2 * | 4/2008 | Nishimura | 310/340 |
| 7,358,655 B2 * | 4/2008 | Ragossnig et al. | 310/358 |
| 7,538,475 B2 * | 5/2009 | Ohmori et al. | 310/328 |
| 7,554,250 B2 * | 6/2009 | Kadotani et al. | 310/365 |
| 7,808,155 B2 * | 10/2010 | Yamamoto et al. | 310/328 |
| 2002/0084872 A1 * | 7/2002 | Kawazoe | 333/186 |
| 2006/0022558 A1 * | 2/2006 | Bindig et al. | 310/366 |
| 2007/0080612 A1 | 4/2007 | Terazono et al. | |
| 2010/0307669 A1 * | 12/2010 | Bindig et al. | 156/242 |

FOREIGN PATENT DOCUMENTS

| | | |
|---|---|---|
| JP | 07 050435 A | 2/1995 |
| JP | 07-226541 A | 8/1995 |
| WO | WO 98/20721 | 5/1998 |

\* cited by examiner

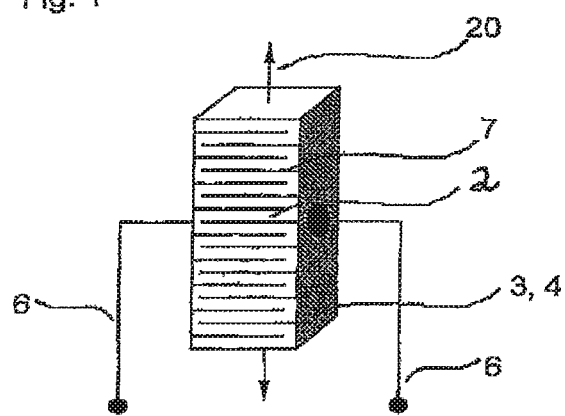
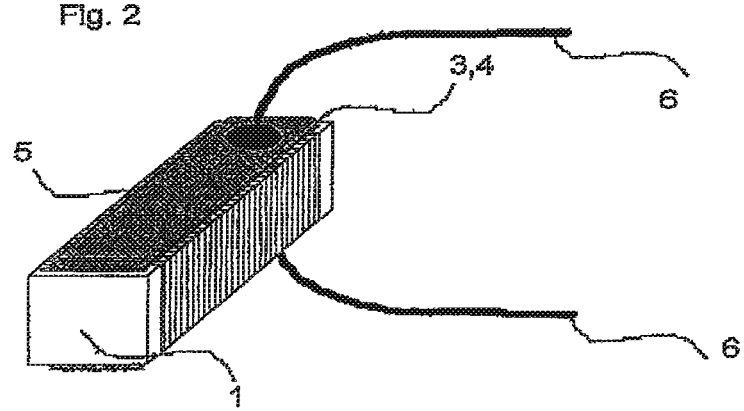

MONOLITHIC MULTI-LAYERED ACTUATOR WITH EXTERNAL ELECTRODES MADE OF A METALLIC, POROUS, EXPANDABLE CONDUCTIVE LAYER

RELATED APPLICATIONS

This application is a §371 application of PCT/EP2009/065433 filed Nov. 19, 2009, which claims priority from German Patent Application No. 10 2008 043 912. 6 filed Nov. 20, 2008 and German Patent Application No. 10 2009 027 192. 9 filed Jun. 25, 2009

The invention concerns a monolithic multi-layered actuator from a sintered stack of thin films of piezoceramic, with incorporated metallic internal electrodes, in which all internal electrodes of one polarity are electrically connected in parallel by base metallisation which is deposited on the stack, and for electrical contacting an external electrode are connected electrically to the base metallisation.

Piezoceramic multi-layered actuators (see FIGS. 1, 2 and 3) consist of stacked thin layers of piezoelectrically active material 2, e.g. lead-zirconate-titanate (PZT), with conductive internal electrodes 7, which are guided alternately to the actuator surface, arranged between them. Base metallisation 3, 4 connects these internal electrodes 7. In this way, the internal electrodes are connected electrically in parallel, and combined into two groups, representing the two terminating poles of the actuator. If a voltage is applied to the terminating pole, it is transmitted onto all internal electrodes in parallel, and causes an electrical field in all layers of active material, which is thus mechanically deformed. The sum of all these mechanical deformations is available at the end surfaces of the actuator as usable expansion and/or force 20.

According to the prior art, piezoceramic multi-layered actuators are implemented as monoliths, i.e. the active material 2, as a so-called green film, before sintering, provided with internal electrodes by a screen printing method, pressed into actuator stacks, pyrolysed and then sintered, the result being the monolithic actuator.

Onto the actuator stack 1, in the region of the brought-out internal electrodes 7, e.g. by galvanic methods or by screen printing metallic paste, base metallisation 3, 4 is deposited. This base metallisation 3, 4 is reinforced by depositing for each base metallisation an external electrode 5 of a metallic material, e.g. by soldering on a structured metal sheet or wire gauze. The electrical connecting wires 6 are soldered to this external electrode 5.

The construction and production of such multi-layered actuators and external electrodes is described in detail in, for example, WO 98/20721, U.S. Pat. No. 5,281,885, U.S. Pat. No. 4,845,399, U.S. Pat. No. 5,406,164 and JP 07-226541 A.

Actuators which are constructed in this way have a disadvantage: during operation, strong tensile stresses act on the insulating region 11 (see FIG. 3), which is under the base metallisation 3, 4. Since this insulating region 11, together with the base metallisation 3, 4, forms a homogeneous unit, it fails when the tensile strength of the weakest element is exceeded, and a crack forms. The cracks begin in the regions of maximum tensile stress 9 and run in the direction of the base metallisation 3, 4. Several of these typical cracks 13, 14 are shown in FIG. 3.

So that these cracks do not tear through the current-carrying layer and/or the external electrodes 5, which would cause the component to fail, this layer must be made expandable, e.g. by implementing it in correspondingly structured form. This procedure is described in detail in EP 0 844 678 A1 or WO 98/20721.

The basis of each of these procedures is metallic parts (metal sheets, wires, fabrics) of complex structure, which are deposited on the base metallisation by soldering or gluing, and are electrically conductive, as the external electrode.

A disadvantage is that these metallic parts must be produced at great cost, and must be deposited on the base metallisation by an expensive and technically extremely challenging and fault-prone process.

The invention is based on the object of improving a monolithic multi-layered actuator according to the pre-characterizing clause of claim 1 so that the external electrode is to be deposited on the base metallisation by simple, inexpensive means, and is expandable so that it reduces the crack elastic energy of cracks occurring in the actuator without being torn through by them. Additionally, a method of producing such a multi-layered actuator should be given.

According to the invention, this object is achieved with respect to the multi-layered actuator by the features of claim 1.

Because the external electrode is a metallic, porous, expandable conductive layer, which consists of metallic particles sintered together and is deposited on the base metallisation, cracks which run from the actuator body through the base metallisation into the conductive layer cannot tear though it, since the crack elastic energy at the tips of the cracks is reduced in the porous texture of the conductive layer.

In a preferred embodiment, the metallic particles are in spherical and/or thread-like form. When thread-like metallic particles are sintered, they give a felt-like structure, which is extremely expandable, because mechanical tensions are converted into rotary movements.

The base metallisation which ensures the adhesion on the ceramic body, and is also the carrier of the conductive layer, must be suitably selected.

Preferably, the metallic part of the base metallisation consists of silver or a silver alloy, and one or more glass-forming substances are mixed into the base metallisation. In a preferred embodiment, the glass-forming substances are PbO, $BiO_2$ or $SiO_2$, since these do not cause any changes of property in the PZT ceramics.

The metallic particles of the conductive layer preferably consist of silver, copper, a silver alloy or a copper alloy, the following materials being specially preferred: Ag, AgPd with the proportion of Pd being up to 30%, Cu, CuNi with the proportion of Ni being up to 50%. CuNi alloys are snore resistant to oxidation than the pure metals, and can be sintered by simpler, less expensive methods.

The spherical metallic particles of the conductive layer preferably have a diameter of 1 to 100 μm, the range of 10 to 50 μm being specially preferred. In this way, the porosity is sufficient to reduce the crack elastic energy.

For reinforcement, the conductive layer can include thread-like metallic particles with a diameter of 5 to 20 μm and a length of 0.1 to 0.5 mm, the proportion of thread-like particles being 1 to 100% of the conductive layer.

For reinforcement, a metallic wire fabric can also be embedded in the conductive layer, the metallic wire fabric preferably consisting of the same metal as the metallic particles of the conductive layer.

In a preferred embodiment, the conductive layer has a thickness of 0.01 to 1 mm, the range of 0.1 to 0.3 mm being specially preferred. At these thicknesses, the fewest actuator failures occurred.

According to the invention, a method of producing a monolithic multi-layered actuator from a sintered stack of thin films of piezoceramic, with incorporated metallic internal electrodes, all internal electrodes of one polarity being electrically connected in parallel by base metallisation which is deposited on the stack, and for electrical contacting an external electrode being connected electrically to the base metallisation, in particular for producing a multi-layered actuator according to the invention, is characterized in that as the external electrode, a paste with, in particular, spherical and/or thread-like metallic particles is deposited on the base metallisation and baked in, the paste being baked in at a temperature which is sufficient to initiate sintering of the metallic particles, but low enough to avoid compressing the metallic particles into a solid body, so that in the baking-in process the paste is transformed into a metallic, porous, expandable conductive layer consisting of sintered metallic particles.

Preferably, the paste is deposited on the base metallisation by means of stencil printing. With this coating technique, the preferred layer thicknesses of 0.1 to 0.3 mm can be generated without problems. The deposited paste is then dried and sintered at higher temperatures, so that it forms a metallic, porous, expandable conductive layer with sufficient current-carrying capacity.

In a preferred embodiment, as the paste a mixture of metallic particles with organic binders and solvents is used, no glass formers being used for the paste, since they would embrittle the sintered conductive layer and reduce its current-carrying capacity.

Preferably, for the paste, spherical, metallic particles with a diameter of 1 to 100 μm, preferably 10 to 50 μm, are used, since they are specially suitable for reducing the crack elastic energy.

For reinforcement, in one embodiment thread-like metallic particles with a diameter of 5 to 20 μm and a length of 0.1 to 0.5 mm are embedded in the paste, the thread-like metallic particles making 1 to 100% of the metallic portion of the paste.

For reinforcement, in another embodiment, at least one metallic wire fabric is embedded in the paste, the metallic wire fabric preferably consisting of the same metal as the metallic particles of the paste.

In a further development of the invention, the location on the conductive layer at which a lead wire is to be soldered on later for electrical contacting is compressed at least superficially.

On actuators with external electrodes implemented in this way, electrical contacts can be deposited at any position of the external electrode by soldering, without this having an effect on the lifetime or other properties of the actuator. It is only necessary to prevent the solder that is used penetrating and undercutting the conductive layer. This is achieved by compressing the conductive layer superficially at the soldering joint, and restricting the soldering time to a few seconds.

The conductive layer is compressed at the desired soldering joint, preferably by moving a steel tool laterally over the surface. At this location, using a suitable solder (Sn alloy), a soldering point is deposited where the lead wire is soldered on later. Other connecting techniques are also possible, e.g. wire bonding or welding.

The thickness of the conductive layer can easily be set by the printing screen. The minimum thickness is based on the actuator type, its specific expansion and thus the distance the cracks in the conductive layer can run (about 50 μm). On the other hand, the maximum thickness is defined by the current requirement of the actuator, and can be up to over 0.5 mm.

The method is described in more detail below:

A low-sintering piezoceramic, e.g. according to DE 198 40 488, is prepared with an organic binder system as a 125 μm thick film. On this film, internal electrode paste of silver-palladium powder in the weight ratio 70/30 and a suitable binder system are deposited by screen printing. A plurality of such films is stacked and pressed into a laminate. The laminate is separated into individual rod-shaped actuators, which are pyrolysed at about 500° C. and sintered at about 1000° C. The actuator base bodies are then machined on all sides.

The base metallisation of, for example, a suitable silver or silver-palladium terminal paste is deposited on the contact sides by means of a screen-printing process and baked in. The glass former which is present in the paste then melts, and joins the sintering metallic portions of the paste to the ceramic base body with strong adhesion.

Now, e.g. by means of stencil printing, a thicker layer of paste (e.g. 0.2 mm thick), consisting of relatively coarse-grained metallic particles (e.g. 80% spherical silver particles with a diameter of 20 μm and 20% thread-like silver particles with a diameter of 20 μm and a length of 0.3 mm), organic binders and solvents is deposited on the base metallisation. This layer contains no glass former, since it would embrittle the conductive layer and reduce its current-carrying capacity.

The paste is now baked in at a temperature which is sufficient to initiate sintering of the metallic particles, but low enough to avoid compressing the particles into a solid body (e.g. for silver 700° C., depending on what grain size is used).

The conductive layer is now compressed at the desired soldering joint by moving a steel tool laterally over the surface. At this location, using a suitable solder (Sn alloy), a soldering point is deposited where the lead wire is soldered on later. Other connecting techniques are also possible at any time, e.g. wire bonding or welding.

It is also possible to deposit the contacting only after varnishing, in which case the soldering or welding region must usually be kept free of varnish.

The actuators are then protected by a varnish layer.

The actuators can now be polarised and measured electrically.

DESCRIPTION OF THE DRAWINGS

FIG. 1 shows schematically the structure of a monolithic multi-layered actuator.

FIG. 2 shows an actuator with further details according to the prior art.

(FIGS. 1 to 3 show the prior art.)

In FIGS. 1 to 3, a multi-layered actuator according to the prior art is shown. In the introduction to the description, these figures are explained in more detail.

FIGS. 4 and 5 show a multi-layered actuator according to this invention, from a sintered stack of thin films of piezoceramic, with incorporated metallic internal electrodes 7. The internal electrodes 7 of one polarity are electrically connected in parallel by a base metallisation 3, 4 which is deposited on the stack. For electrical contacting, an external electrode 5 is connected electrically to the base metallisation 3, 4.

According to the invention, this external electrode 5 is a metallic, porous, expandable conductive layer 10, which consists of spherical and/or thread-like metallic particles 12 sintered together. FIG. 5 shows this conductive layer 10 schematically as individual circles which are intended to symbolise the individual metallic particles 12. It is important here that the paste and the metallic particles 12 in it are baked in at a temperature which is sufficient to initiate sintering of the metallic particles 12, but low enough to avoid compressing the metallic particles 12 into a solid body, so that in the baking-in process the metallic particles are transformed into a metallic, porous, expandable conductive layer 10. "Solid body" is understood here to mean a body without internal cavities and with a closed surface. This would be not porous and not expandable.

Figure 3:
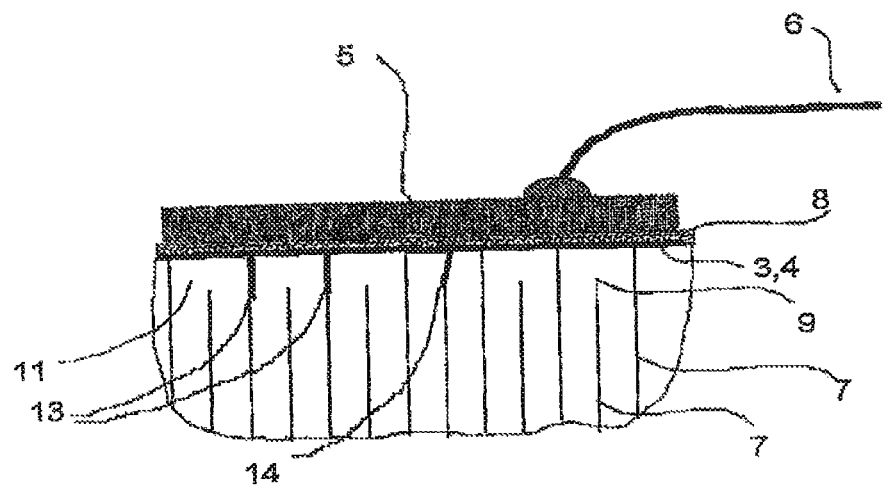
FIG. 3 shows a section of the actuator, with the typical cracks which occur after about $10^6$ stress cycles.
Figure 4:
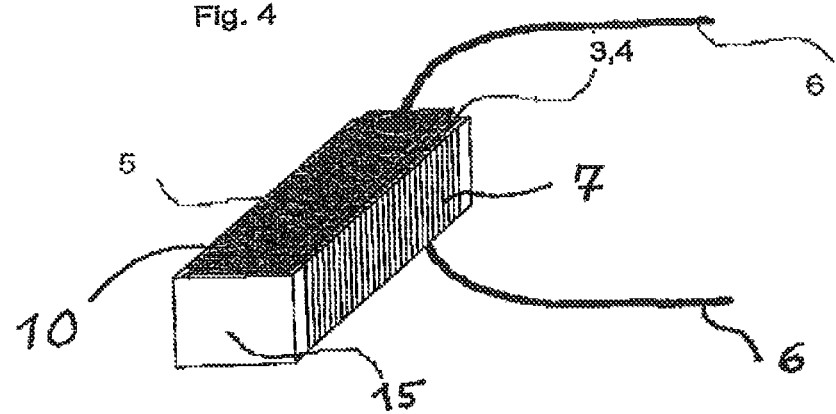
FIG. 4 shows an actuator with base metallisation and a conductive layer according to this invention.
Figure 5:
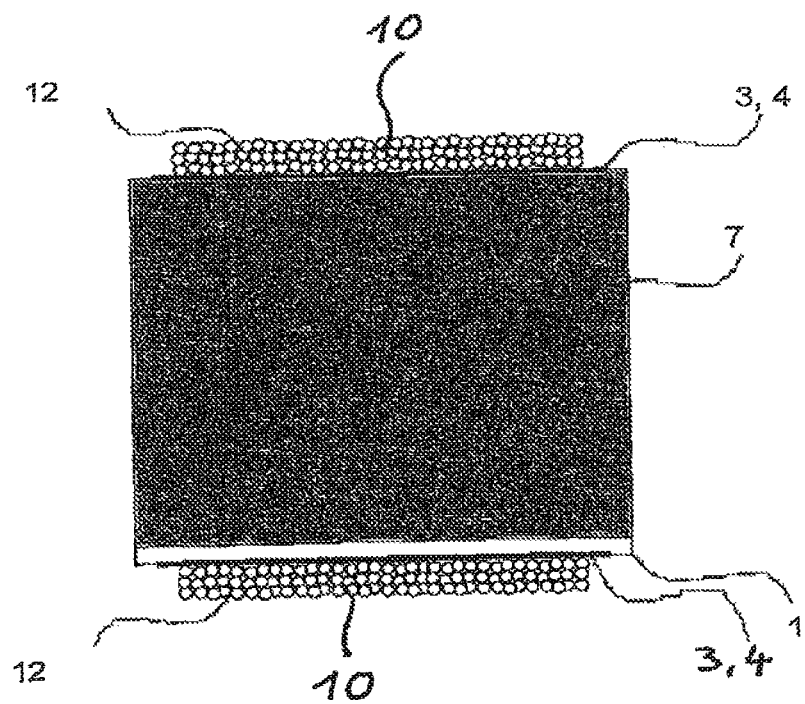
FIG. 5 shows a schematic enlargement (cross-section) of an actuator according to this invention, showing the metallic particles in the conductive layer.

This conductive layer 10 can be imagined as a sponge or felt, with internal cavities and an open-pored surface. The conductive layer 10 is therefore connected to the base metallisation 3, 4 via only partial contact points, and rises away from the base metallisation 3, 4 between the contact points. In this way the conductive layer 10 is expandable between the contact points, and can absorb the crack elastic energy which occurs in the actuator without separation of the electrical connection and thus failure of the actuator occurring.

This conductive layer 10 is produced from a paste which is a mixture of spherical and/or thread-like metallic particles 12 with organic binders and solvents. This paste is deposited on the base metallisation 3, 4 by means of screen printing or stencil printing, and baked in by targeted energy feed. This method is described in detail above.

The invention claimed is:

1. A monolithic multi-layered actuator comprising
a sintered stack of thin films of piezoceramic;
incorporated metallic internal electrodes, wherein which all metallic internal electrodes of one polarity are electrically connected in parallel by base metallization which is deposited on the stack of thin films of piezoceramic and for electrical contacting an external electrode is connected electrically to the base metallization, wherein the external electrode is a metallic, porous, expandable conductive layer, which comprises metallic particles sintered together and is deposited on the base metallization,
wherein the metallic particles are of spherical shape, and
wherein the spherical metallic particles of the conductive layer have a diameter of 10 to 50 μm.

2. A multi-layered actuator according to claim 1, wherein the metallic part of the base metallization consists of silver or a silver alloy, and one or more glass-forming substances are mixed into the base metallization.

3. A multi-layered actuator according to claim 1, wherein the metallic part of the base metallization consists of silver or a silver alloy, and one or more glass-forming substances are mixed into the base metallization.

4. A multi-layered actuator according to claim 2, wherein the glass-forming substances are PbO, BiO$_2$ or SiO$_2$.

5. A multi-layered actuator according to claim 3, wherein the glass-forming substances are PbO, BiO$_2$ or SiO$_2$.

6. A multi-layered actuator according to claim 1, wherein the metallic particles of the conductive layer consist of silver, copper, a silver alloy or a copper alloy.

7. A multi-layered actuator according to claim 1, wherein the metallic particles of the conductive layer comprise at least one member selected from the group consisting of Ag, AgPd with the proportion of Pd being up to 30%, Cu, and CuNi with the proportion of Ni being up to 50%.

8. A multi-layered actuator according claim 1, wherein the conductive layer includes short-fiber metallic threads with a diameter of 5 to 20 μm and a length of 0.1 to 0.5 mm, the proportion of metal threads being 1 to 100% of the conductive layer.

9. A multi-layered actuator according to claim 1, wherein a metallic wire fabric is embedded in the conductive layer.

10. A multi-layered actuator according to claim 9, the metallic wire fabric comprises the same metal as the metallic particles of the conductive layer.

11. A multi-layered actuator according to claim 1, wherein the conductive layer has a thickness of 0.01 to 1 mm.

12. A method of producing a monolithic multi-layered actuator according to claim 1, wherein the external electrode is formed by depositing a paste with at least one of spherical or thread-like metallic particles on the base metallization and baking them in, the paste being baked in at a temperature which is sufficient to initiate sintering of the metallic particles, but low enough to avoid compressing the metallic particles into a solid body, so that in the baking-in process the paste is transformed into a metallic, porous, expandable conductive layer consisting of sintered metallic particles.

13. A method according to claim 12, wherein the paste is deposited on the base metallization by stencil printing.

14. A method according to claim 12, wherein the paste comprises a mixture of spherical or thread-like metallic particles with an organic binder and a solvent, and no glass formers being used for the paste.

15. A method according to claim 12, wherein the paste includes thread-like metallic particles with a diameter of 5 to 20 μm and a length of 0.1 to 0.5 mm, the proportion of metallic fibers being 1 to 100% of the metallic portion of the paste.

16. A method according to claim 12, wherein at least one metallic wire fabric is embedded in the paste.

17. A method according to claim 16, wherein the metallic wire fabric comprises of the same metal as the metallic particles of the paste.

18. A method according to claim 17, wherein the location on the conductive layer at which a lead wire is to be soldered on later for electrical contacting is compressed at least superficially.

* * * * *